United States Patent
Tosch (10) Patent No.: US 10,014,700 B2
(45) Date of Patent: Jul. 3, 2018

(54) INTEGRATED BATTERY SAFETY INTERLOCK

(71) Applicant: Johnson Controls Technology Company, Plymouth, MI (US)

(72) Inventor: Charles S. Tosch, Port Washington, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 146 days.

(21) Appl. No.: 15/141,438

(22) Filed: Apr. 28, 2016

(65) Prior Publication Data

US 2017/0229884 A1    Aug. 10, 2017

Related U.S. Application Data (60) Provisional application No. 62/291,096, filed on Feb. 4, 2016.

(51) Int. Cl.
| | | |
|---|---|---|
| *B60L 1/00* | (2006.01) | |
| *B60L 3/04* | (2006.01) | |
| *H02J 7/00* | (2006.01) | |
| *B60L 3/00* | (2006.01) | |
| *B60L 11/18* | (2006.01) | |

(52) U.S. Cl.
CPC .......... *H02J 7/0031* (2013.01); *B60L 3/0046* (2013.01); *B60L 11/1851* (2013.01)

(58) Field of Classification Search
CPC ... H02J 7/0031; B60L 3/0046; B60L 11/1851; B60L 1/00; B60L 3/04
USPC ................................ 307/9.1, 10.1, 10.7, 131
See application file for complete search history.

(56) References Cited

U.S. PATENT DOCUMENTS

| | | |
|---|---|---|
| 6,411,098 B1 | 6/2002 | Laletin |
| 8,571,738 B1 | 10/2013 | Potter et al. |
| 9,026,393 B2 | 5/2015 | Xiang et al. |
| 9,067,546 B2 | 6/2015 | Meyer et al. |
| 9,150,108 B2 | 10/2015 | Wang et al. |
| 2003/0206021 A1 | 11/2003 | Laletin et al. |
| 2010/0185405 A1 | 7/2010 | Aoshima et al. |
| 2015/0224881 A1 | 4/2015 | Deyda et al. |
| 2015/0197153 A1 | 7/2015 | Luedtke et al. |

(Continued)

FOREIGN PATENT DOCUMENTS

| | | |
|---|---|---|
| CN | 101570181 | 11/2009 |
| CN | 105150856 | 12/2015 |
| FR | 2749397 | 12/1997 |

OTHER PUBLICATIONS

PCT/US2016/045101 International Search Report and Written Opinion dated Nov. 2, 2016.

*Primary Examiner* — Hal Kaplan
(74) *Attorney, Agent, or Firm* — Fletcher Yoder, P.C.

(57) ABSTRACT

The present disclosure includes a battery system that may include a first terminal and a second terminal electrically coupled to an electronic component. The system may also include a current source electrically coupled to the first terminal. The system may also include a control system that may direct an asynchronous current from the current source to the first terminal according to a pattern and receive a current signal status from a current detector. The current signal status is associated with a second current received via the second terminal. The control system may disconnect the electronic component from the first terminal or the second terminal when the current signal status does not correspond to the pattern.

23 Claims, 6 Drawing Sheets

(56) References Cited

U.S. PATENT DOCUMENTS

2015/0293180 A1 10/2015 Dulle
2016/0018471 A1 1/2016 Lee

INTEGRATED BATTERY SAFETY INTERLOCK

CROSS REFERENCE TO RELATED APPLICATIONS

This application claims priority from and the benefit of U.S. Provisional Application Ser. No. 62/291,096, entitled "SAFETY INTERLOCK UTILIZING AN ASYNCHRONOUS CURRENT SOURCE", filed Feb. 4, 2016, which is hereby incorporated by reference.

BACKGROUND

The present disclosure generally relates to the field of batteries and battery modules. More specifically, the present disclosure relates to an integrated battery safety interlock to prevent the modification of a battery module.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 volt or 130 volt systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator.

Further, a micro-hybrid electric vehicle (mHEV) also uses a "Stop-Start" system similar to the mild hybrids, but the micro-hybrid systems of an mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

Given that battery modules are used to provide power to these vehicles, the battery modules are integral to the operation of these vehicles. As such, it may be useful to prevent the battery module from being modified. Accordingly, it may be useful to employ circuitry that monitors various properties of the battery modules and components coupled to the battery modules.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, an automotive battery system that may include a first terminal and a second terminal electrically coupled to an electronic component. The system may also include a current source electrically coupled to the first terminal. The system may also include a control system that may direct an asynchronous current from the current source to the first terminal according to a pattern and receive a current signal status from a current detector. The current signal status is associated with a second current received via the second terminal. The control system may disconnect the electronic component from the first terminal or the second terminal when the current signal status does not correspond to the pattern.

In another embodiment, a non-transitory computer-readable medium may include computer-executable instructions that cause a processor to cause a current source to output an asynchronous current to a first terminal of a battery module according to a pattern and receive a current signal status from a current detector electrically coupled to a second terminal of the battery module. The current signal status may be associated with a second current received via the second terminal. The processor may then send a disable signal to an input/output (I/O) component when the current signal status does not correspond to the pattern, wherein the disable signal is configured to cause the I/O component to disconnect an electronic component electrically coupled to first terminal or the second terminal from the first terminal or the second terminal.

In another embodiment, a system may include a lead acid battery and a lithium ion battery electrically coupled to the lead acid battery. The system may also include a battery control unit communicatively coupled to the lead acid battery and the lithium ion battery. The battery control unit may include a first terminal and a second terminal configured to electrically couple to an electronic component, a current source electrically coupled to the first terminal, and a processor. The processor may send an activation pattern to the current source that may output a first current according to the activation pattern to the first terminal. The first terminal may be serially coupled to the electronic component. The processor may then send a current signal to the current source, such that the current signal includes a current pattern that indicates at least two different current values for the first current output by the current source. The processor may then receive a signal status from a current detector electrically coupled to the second terminal, such that the signal status comprises a waveform indicating one or more current values of a second current received via the second terminal. The processor may then send a disable signal to an input/output (I/O) component when the signal status does not match the activation pattern and the current signal, such that the disable signal may cause the I/O component to disconnect the electronic component from the first terminal or the second terminal.

DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure relates to batteries and battery modules. More specifically, the present disclosure relates to interlocking a battery module using an asynchronous current source, thereby preventing unauthorized modification or access to the battery module.

Generally, a vehicle may include a battery system to provide motive force for the vehicle. As such, the battery system may include a number of battery modules, such as a lithium-ion battery module, a lead-acid battery module, and the like. In one embodiment, the lithium-ion battery module may include circuitry that monitors the SOH and SOC of each of a number of lithium ion cells of the lithium ion battery module, as well as a number of other properties related to the lithium ion battery module. In addition to monitoring the properties of the lithium ion battery module, the circuitry may also monitor various aspects of the lead acid battery module, which may be coupled in series with the lithium ion battery module at one terminal.

To effectively monitor the integrity of the battery module, a battery control unit within the battery module may asynchronously activate and deactivate a current source that outputs current through one terminal of the battery module and receives the same current via another terminal of the battery module. In one embodiment, that battery control unit may monitor the current received via the other terminal and compare the received current signal with a pattern in which the current source has been activated and deactivated. If the battery control unit detects a discrepancy between the received current signal and the pattern of activation of the current source, the battery control unit may disable components coupled to the battery control unit. As a result, the battery control unit may detect attempts to modify or alter the battery module and disconnect the battery module from other components to prevent the alteration of the operation of the battery module.

In one embodiment, the battery control unit may serve as an interlock for improved quality of service for personnel in high voltage (HV) applications (e.g., >60V). As such, the circuits being protected by the interlock may routed through the external connections of the battery module, and the battery control unit may monitor the integrity of those connections. For example, if a service technician removes a high voltage bus or other connector while the vehicle/system is energized, the battery control unit may automatically disconnect the HV battery from the external bus connections via contactors. Additional details with regard to monitoring the battery module will be discussed below with reference to FIGS. 1-7.

In addition to monitoring the battery module, as discussed above, the battery control unit may also be employed to control the operation of various types of batteries for use in vehicle systems. For instance, the vehicle system may include a battery xEV vehicle systems, which may provide advantages over traditional gas-powered vehicle technology. Further, battery xEV technology has led to improvements in fuel economy and/or reductions in undesirable emissions compared to more traditional gas-powered vehicles. For example, regenerative braking vehicles capture and store electrical energy generated when the vehicle is braking or coasting. The captured electrical energy may then be utilized to supply power to the vehicle's electrical system. As another example, battery modules in accordance with present embodiments may be incorporated with or provide power to stationary power systems (e.g., non-automotive systems).

Based on the advantages over traditional gas-powered vehicles, manufacturers, which generally produce traditional gas-powered vehicles, may desire to utilize improved vehicle technologies (e.g., regenerative braking technology) within their vehicle lines. Often, these manufacturers may utilize one of their traditional vehicle platforms as a starting point. Accordingly, since traditional gas-powered vehicles are designed to utilize 12-volt battery systems, a 12-volt lithium ion battery may be used to supplement a 12-volt lead-acid battery. More specifically, the 12-volt lithium ion battery may be used to more efficiently capture electrical energy generated during regenerative braking and subsequently supply electrical energy to power the vehicle's electrical system.

However, as advancements occur with vehicle technologies, high voltage electrical devices may be included in the vehicle's electrical system. For example, the lithium ion battery may supply electrical energy to an electric motor in a mild-hybrid vehicle. Often, these high voltage electrical devices utilize voltage greater than 12 volts, for example, up to 48 volts. Accordingly, in some embodiments, the output voltage of a 12-volt lithium ion battery may be boosted using a DC-DC converter to supply power to the high voltage devices. Additionally or alternatively, a 48-volt lithium ion battery may be used to supplement a 12-volt lead-acid battery. More specifically, the 48-volt lithium ion battery may be used to more efficiently capture electrical energy generated during regenerative braking and subsequently supply electrical energy to power the high voltage devices.

Thus, the design choice regarding whether to utilize a 12-volt lithium ion battery or a 48-volt lithium ion battery may depend directly on the electrical devices included in a particular vehicle. Nevertheless, although the voltage characteristics may differ, the operational principles of a 12-volt lithium ion battery and a 48-volt lithium ion battery are generally similar. More specifically, as described above, both may be used to capture electrical energy during regenerative braking and subsequently supply electrical energy to power electrical devices in the vehicle.

Accordingly, to simplify the following discussion, the present techniques will be described in relation to a battery system with a 12-volt lithium ion battery and a 12-volt lead-acid battery. However, one of ordinary skill in art should be able to adapt the present techniques to other battery systems, such as a battery system with a 48-volt lithium ion battery and a 12-volt lead-acid battery or any other suitable combination of batteries.

Figure 1:
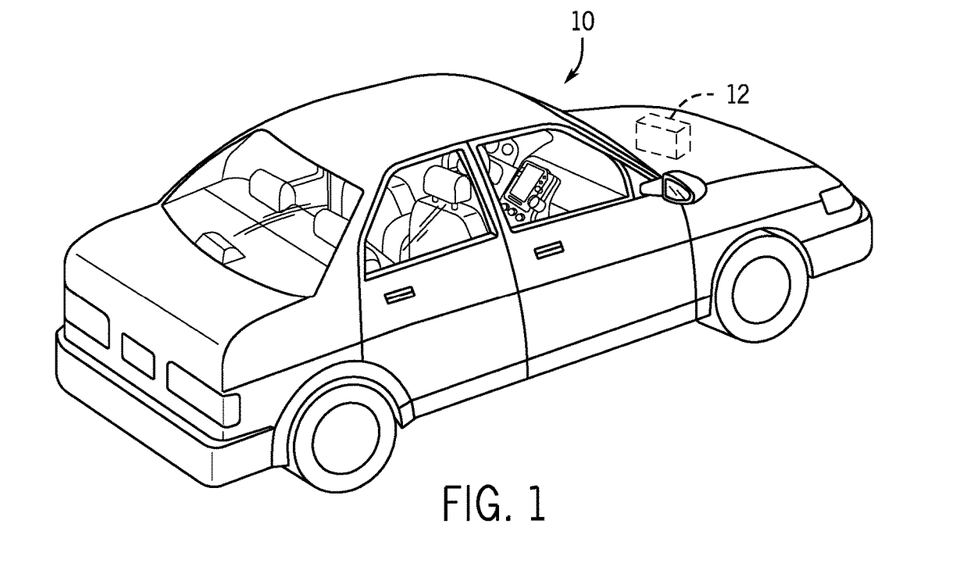
FIG. 1 is perspective view of a vehicle (e.g., an xEV) having a battery system contributing all or a portion of the power for the vehicle, in accordance with an embodiment presented herein.

With the preceding in mind, the present disclosure describes systems and techniques for monitoring properties of the battery module. By way of introduction, FIG. 1 is a perspective view of an embodiment of a vehicle 10, which may utilize a regenerative braking system. Although the following discussion is presented in relation to vehicles with regenerative braking systems, the techniques described herein may be applied to other vehicles including xEV and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
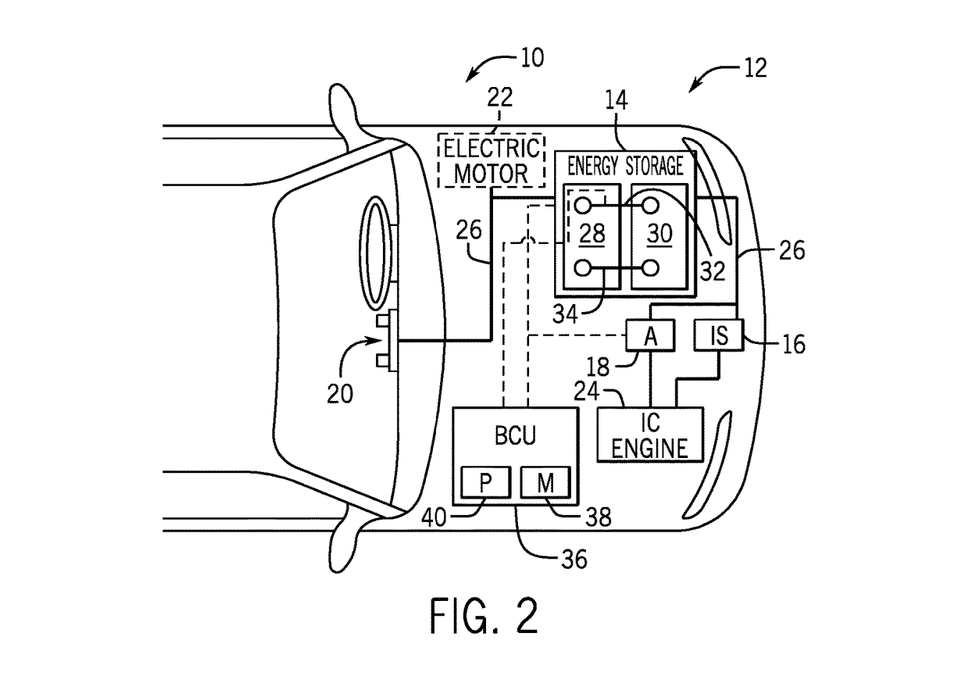
FIG. 2 is a cutaway schematic view of the vehicle of FIG. 1 in the form of a hybrid electric vehicle (HEV), in accordance with an embodiment presented herein.

A more detailed view of the battery system 12 is described in FIG. 2. As depicted, the battery system 12 includes battery module 14 coupled to an ignition system 16, an alternator 18, a vehicle console 20, and optionally to an electric motor 22. Generally, the battery module 14 may capture/store electrical energy generated in the vehicle 10 and output electrical energy to power electrical devices in the vehicle 10.

More specifically, the battery module 14 may capture/store generated electrical energy and output electrical energy to power each of these components, as well as others. In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, the battery module 14 depicted in FIG. 2 supplies power to the vehicle console 20 and the ignition system 16 to start (e.g., crank) the internal combustion engine 24. In some embodiments, the ignition system 16 may include a traditional starter and/or a belt starter generator (BSG).

Additionally, the battery module 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. In other words, the battery module 14 may capture electrical energy generated during regenerative braking.

To facilitate capturing and supplying electric energy, the battery module 14 may be coupled to the vehicle's electric system via a bus 26. For example, the bus 26 may enable the battery module 14 to receive electrical energy generated by the alternator 18 and/or the electric motor 22. Additionally, the bus 26 may enable the battery module 14 to output electrical energy to the ignition system 16 and/or the vehicle console 20. Accordingly, when a 12-volt battery system 12 is used, the bus 26 may carry electrical power typically between 8-18 volts.

Additionally, the battery module 14 may include multiple battery modules. For example, in the depicted embodiment, the battery module 14 includes a lead acid battery 28 and a lithium ion battery 30, which each includes one or more battery cells. In other embodiments, the battery module 14 may include any number of battery modules. Additionally, although the lead acid battery 28 and the lithium ion battery 30 are depicted adjacent to one another, they may be positioned in different areas around the vehicle. For example, the lithium ion battery 30 may be positioned in or about the interior of the vehicle 10 while the lead acid battery 28 may be positioned under the hood of the vehicle 10.

By employing the lead acid battery 28 with the lithium ion battery 30, the performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

Figure 3:
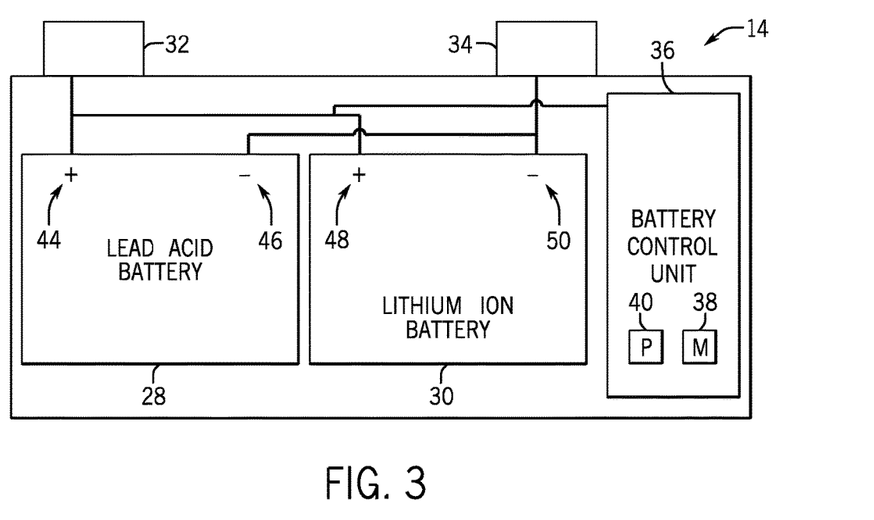
FIG. 3 is a schematic view of a battery system with a first battery, a second battery, and a battery control unit, in accordance with an embodiment presented herein.

To facilitate supply of power from the battery system 12 to the various components in the vehicle's electrical system (e.g., HVAC system and vehicle console 20), the battery module 14 includes a first terminal 32 and a second terminal 34. In some embodiments, the second terminal 34 may provide a ground connection and the first terminal 32 may provide a positive voltage ranging between 7-18 volts. A more detailed view of an embodiment of the battery module 14 is depicted in FIG. 3. As previously noted, the battery module 14 may have dimensions comparable to those of a typical lead-acid battery to limit modifications to the vehicle 10 design to accommodate the battery system 12. For example, the battery module 14 may be of similar dimensions to an H6 battery, which may be approximately 13.9 inches×6.8 inches×7.5 inches. As depicted, the battery module 14 may be included within a single continuous housing. In other embodiments, the battery module 14 may include multiple housings coupled together (e.g., a first housing including the lead acid battery 28 and a second housing including the lithium ion battery 30). In still other embodiments, as mentioned above the battery module 14 may include the lead acid battery 28 located under the hood of the vehicle 10, and the lithium ion battery 30 may be located within the interior of the vehicle 10.

As depicted, the battery module 14 includes the first terminal 32, the second terminal 34, the lead acid battery 28, the lithium ion battery 30, and a battery control unit 36. As used herein, the battery control unit 36 generally refers to control components that control operation of the battery system 12, such as relays within the battery module 14 or switches in the alternator 18. The operation of the battery module 14 may be controlled by the battery control unit 36. For example, the battery control unit 36 is configured to regulate an amount of electrical energy captured/supplied by each battery 28 or 30 (e.g., to de-rate and re-rate the battery system 12), perform load balancing between the batteries, control charging and discharging of the batteries (e.g., via relays or DC/DC converters), determine a state of charge of each battery and/or the entire battery module 14, activate an active-cooling mechanism, activate a short circuit protection system, and the like.

Accordingly, the battery control unit 36 may include one or more memory 38 and one or more processor 40 programmed to execute control algorithms for performing such tasks. More specifically, the one or more processor 40 may include one or more application specific integrated circuits (ASICs), one or more field programmable gate arrays (FPGAs), one or more general purpose processors, or any combination thereof. Additionally, the one or more memory 38 may include volatile memory, such as random access memory (RAM), and/or non-volatile memory, such as read-only memory (ROM), optical drives, hard disc drives, or solid-state drives. In some embodiments, the battery control unit 36 may include portions of a vehicle control unit (VCU) and/or a separate battery control module. Additionally, as depicted, the battery control unit 36 may be included separate from the battery module 14, such as a standalone module. In other embodiments, as depicted in FIG. 3, the battery control unit 36 may be included within the battery module 14.

Additionally, as depicted in FIG. 2, the lead acid battery 28 and the lithium ion battery 30 are connected in parallel across the first terminal 32 and the second terminal 34 to enable charging and discharging of the batteries. As described above, the battery terminals 32 and 34 may output the power stored in the battery module 14 to provide power to the vehicle's electrical system. Further, the battery terminals 32 and 34 may also input power to the battery module 14 to enable the lead acid battery 28 and the lithium ion battery 30 to charge, for example, when the alternator 18 generates electrical power through regenerative braking.

To provide more detail as to the battery module 14, FIG. 3 illustrates a schematic view of components of the battery module 14. As depicted, the lead acid battery 28 and the lithium ion battery 30 are separate within the battery module 14, which enables each to be configured based on desired characteristics, such as output voltage. For example, the output voltage of the lead acid battery 28 and lithium ion battery 30 may depend on the configuration of individual battery cells within each battery (e.g., in serial or parallel) and the battery chemistries selected. Further, the configuration of battery cells and the battery chemistries selected may result in certain advantages specific to multiple battery chemistries and cell arrangements. For example, the advantages may include an increased range in charging voltages, or the advantages may include varied power and charging capacities within the battery module 14.

Additionally, as discussed above and shown in FIG. 3, the lead acid battery 28 and the lithium ion battery 30 may couple to the first terminal 32 and the second terminal 34 in a parallel manner. In other words, a positive terminal 44 of the lead acid battery 28 may electrically couple to the first terminal 32 of the battery module 14, and a negative terminal 46 may electrically couple to the second terminal 34 of the battery module 14. In a similar manner, a positive terminal 48 of the lithium ion battery 30 may electrically couple to the first terminal 32 of the battery module 14, and a negative terminal 50 of the lithium ion battery 30 may electrically couple to the second terminal 34 of the battery module 14. In this manner, the two batteries 28, 30 may electrically couple in parallel with each other to the bus 26 to provide power to various components of the electrical system of the vehicle 10.

Although the lead acid battery 28 and the lithium ion batter 30 are illustrated in FIG. 3 as being coupled in parallel with each other, it should be noted that the presently disclosed embodiments may be incorporated into any suitable battery system. For instance, the presently disclosed embodiments may be implemented in a high voltage system that does not connect the lead acid battery 28 in parallel with the lithium ion battery 30. Instead, the presently disclosed embodiments may be coupled to a single battery, a series of batteries, and the like.

Figure 4:
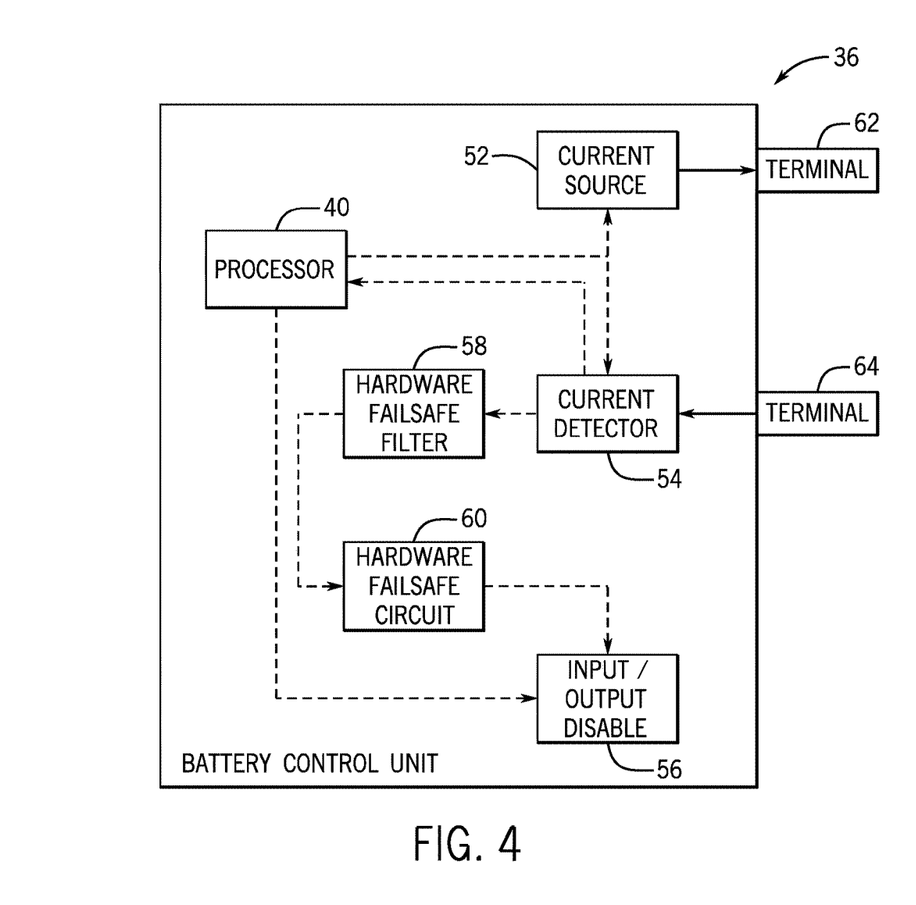
FIG. 4 is a schematic diagram of a battery control unit of the battery system of FIG. 3, in accordance with an embodiment presented herein.

With the foregoing in mind, FIG. 4 is a schematic diagram of the battery control unit 36 and various components that may be employed to monitor various properties of the battery control unit 36. As shown in FIG. 4, the battery control unit 36 may include the processor 40, a current source 52, a current detector 54, an input/output disable component 56, a hardware failsafe filter 58, a hardware failsafe circuit 60, a terminal 62, and a terminal 64. The processor 40, as discussed above, may include any suitable processor capable of executing computer-executable instructions.

In some embodiments, the processor 40 may send a signal to the current source 52 indicating a pattern in which to activate and deactivate the current source 52. As such, the current source 52 may include any suitable circuit that outputs some current (e.g., 10 mA, 20 mA). In addition to providing the activation pattern to the current source 52, the processor 40 may provide a current signal to the current source 52. The current signal may specify a pattern in which different current values are to be output by the current source 52. For example, the current signal may indicate to the current source 52 to switch or alternate between a 10 mA current and a 20 mA current. Although this example corresponds to switching between two current values, it should be noted that the current signal may provide a pattern that switches between any suitable number of current values that the current source 52 may be capable of outputting.

Upon receiving the activation pattern and the current signal from the processor 40, the current source 52 may output a current that corresponds to the activation pattern and the current signal to the terminal 62. The terminal 62 may be a battery service disconnect, a high voltage connector, or other interface that may be coupled to a circuit or circuit components (e.g., electronic components) that the battery control unit 36 may monitor to prevent from being modified or accessed. By way of example, the circuit components coupled to the terminal 62 and being monitored by the battery control unit 36 may include a service disconnect for the battery module, a high voltage (HV) direct-current (DC) link connector for the battery module, a motor control system HV DC link connector, and the like.

The current output via the terminal 62 may be routed serially through the intervening circuits or circuit components to the terminal 64, which may also include a battery service disconnect, a high voltage connector, or other interface. The current received via the terminal 64 may be provided to the current detector 54. The current detector 54 may be a circuit component that includes a switchable window current detector that may monitor the current received via the terminal 64. In one embodiment, the current detector 54 may include a window detector switching function that is synchronized with the current signal provided to the current source 52 discussed above. As such, the current detector 54 may monitor the switching of the current output by the current source 52 with respect to the current signal provided by the processor 40.

In addition to the current signal, the current detector 54 may receive the activation pattern provided to the current source 52 from the processor 40. As such, the current detector 54 may determine whether the current received via the terminal 64 matches the active and inactive states specified in the pattern. Additional details with regard to determining whether the received current corresponds to the current signal and the activation pattern will be discussed with reference to FIGS. 5-7 below.

In some embodiments, the current detector 54 may compare the activation pattern and the current signal to the received current and send a delta or difference signal to the processor 40. The delta signal may indicate the difference between the activation pattern and the current signal with respect to the received current. As such, the delta signal may be used to determine whether there is a discrepancy between the activation pattern and the current signal with respect to the received current. In other embodiments, the current detector 54 may provide the processor 40 a signal or representation of the current received via the terminal 64. In this case, the processor 40 may compare the activation pattern and the current signal to the received current and determine the delta signal. For instance, if the activation pattern matches the current signal, the delta signal may be zero until the activation pattern does not match the current signal. At this time, the delta signal may change from low to high (e.g., 1) to indicate that a difference between the activation pattern and the current signal is present.

In either situation, the output of the current detector 54 may be provided to the hardware failsafe filter 58. The hardware failsafe filter 58 may receive the delta signal from the current detector 54 and determine whether the delta signal indicates that an error is present for a period of time that is greater than some value (e.g., 50 ms). If the hardware failsafe filter 58 determines that the error is present for longer than the specified amount of time, the hardware failsafe filter 58 may send an indication of the error to the hardware failsafe circuit 60. If, however, the hardware failsafe filter 58 determines that the error is not present for longer than the specified amount of time, the hardware failsafe filter 58 may not perform any action. For instance, if the threshold is 50 ms, the hardware failsafe filter 58 may not perform any action unless the delta signal indicates that a difference between the activation pattern and the current signal is present for longer than 50 ms.

When the hardware failsafe circuit 60 receives the indication of the error, the hardware failsafe circuit 60 may send a command to the input/output (I/O) disable component to disable the I/O components coupled to the battery control unit 36 or the like. In one embodiment, the I/O disable component 56 may include an electrical switch that breaks an electrical connection or a connection path between one or more I/O components and the battery control unit 36. Although the current detector 54, the I/O disable component 56, the hardware failsafe filter 58, and the hardware failsafe circuit 60 are described herein as individual components, it should be noted that, in some embodiments, two or more of these components may be incorporated together within a single circuit.

Referring back to the processor 40, in one embodiment, the processor 40 may compare the output of the current detector 54 with the activation pattern and the current signal sent to the current source 52 to determine whether the output of the current detector 54 corresponds to or matches the activation pattern and the current signal. If the output matches an expected output of the current detector 54, the processor 40 may continue to monitor the received output from the current detector 54. If, however, the output does not match the expected output of the current detector 54, the processor 40 may send a command to the I/O disable component 56 to disable the I/O components coupled to the battery control unit 36 as discussed above. For example, if the monitored component is modified or accessed by some user, the current conducted serially through the component to the current detector 54 may be altered. As such, the current detected by the current detector 54 may not match or correspond to the activation pattern and the current signal provided to the current source 52. In this case, upon determining that the current detected by the current detector 54 may not match or correspond to the activation pattern and the current signal provided to the current source 52, the processor 40 may send a command to the I/O disable component 56 to disable the I/O components coupled to the battery control unit 36 as discussed above.

In the same manner as the hardware failsafe filter 58, the processor 40 may also determine whether output of the current detector 54 indicates that an error is present for a period of time that is greater than some value (e.g., 50 ms) and send the command to the I/O disable component 56 to disable the I/O components coupled to the battery control unit 36 when the error is present for longer than the period of time.

Figure 5:
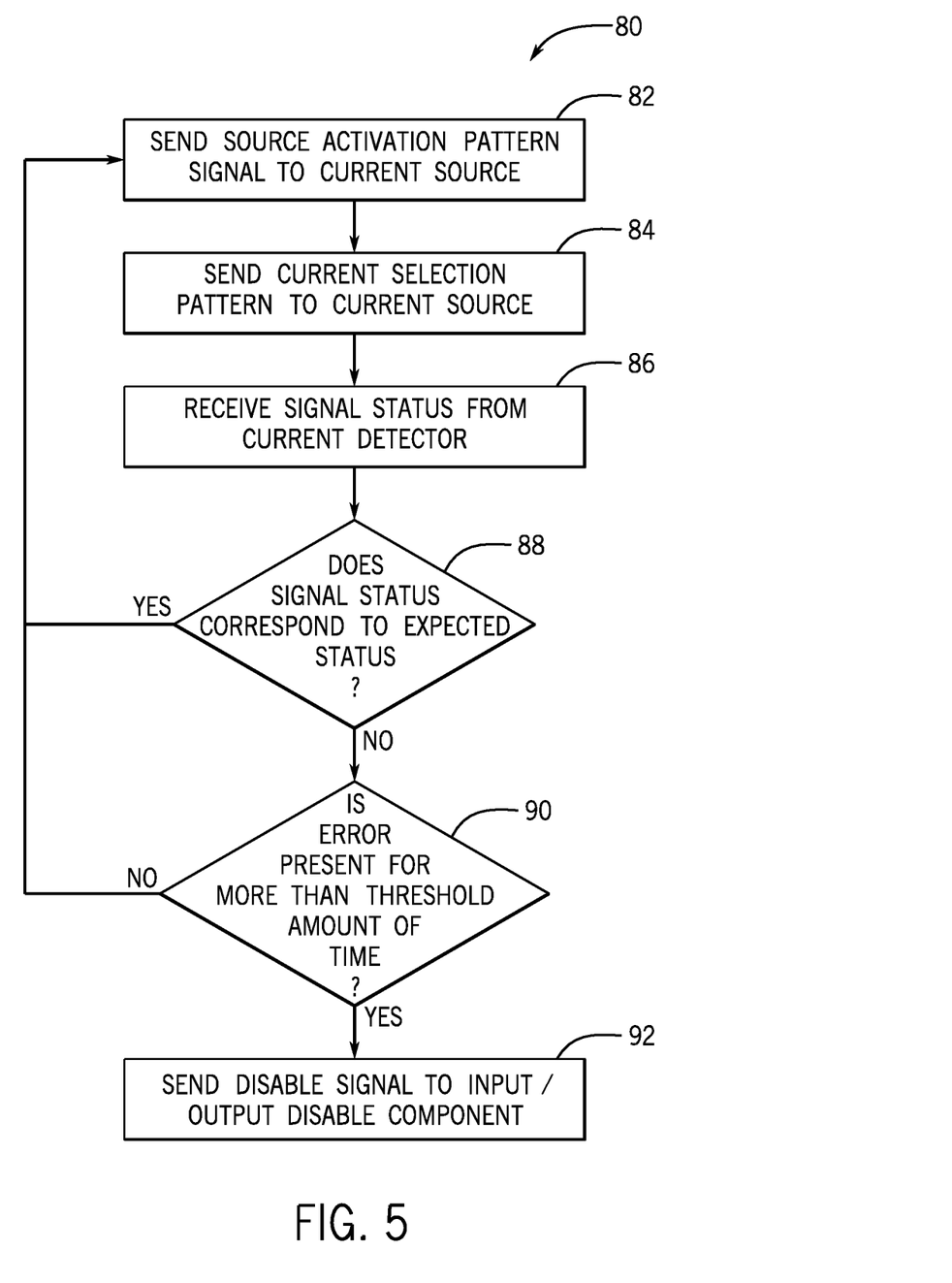
FIG. 5 is a flow chart describing a method for monitoring properties of the battery system of FIG. 3, in accordance with an embodiment presented herein.

With the foregoing in mind, FIG. 5 illustrates a flowchart of a method 80 that the processor 40 may use for monitoring properties of components coupled to the battery control unit 36 as described above. Although the following description of the method 80 is described as being performed by the processor 40, it should be noted that the method 80 may be performed by any suitable processor(s). In addition, although the method 80 is described in a particular order, it should be understood that the method 80 may be performed in a variety of suitable orders.

Figure 6:
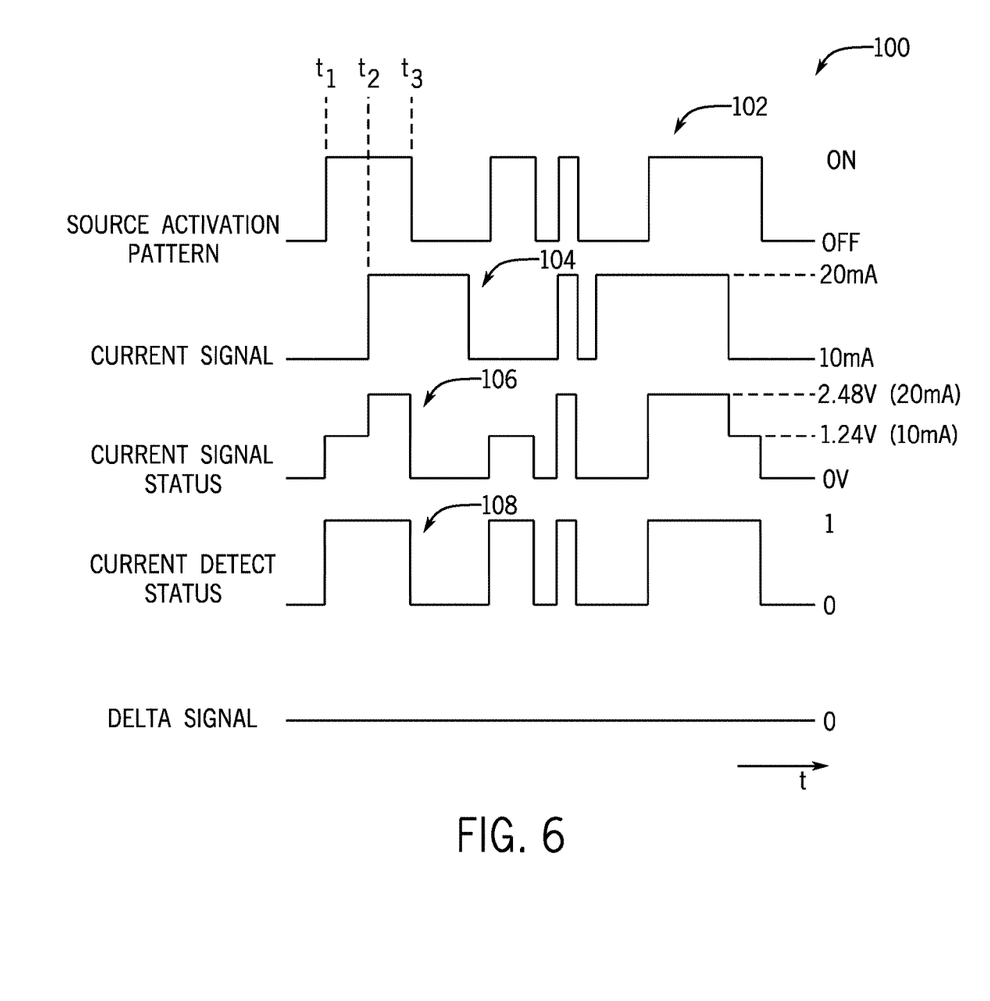
FIG. 6 includes example waveforms depicting the states of various components within the battery control unit of FIG. 4 while operating under normal conditions, in accordance with an embodiment presented herein.

Referring now to FIG. 5, at block 82, the processor 40 may send a command to the current source 52 to activate according to a source activation pattern signal. The source activation pattern, which may be part of the command, may be an asynchronous signal that indicates when the current source 52 should activate and deactivate. In other words, the source activation pattern may correspond to when the current source 52 outputs a current and when it does not output a current. In one embodiment, the asynchronous signal may be randomly generated by the processor 40 using a random function or the like. FIG. 6 illustrates a collection of waveforms 100 that includes an example source activation pattern waveform 102 that indicates when the current source 52 will output current and when it will not output current.

In addition to the source activation pattern, at block 84, the processor 40 may send the current signal 104 to the current source 52. As discussed above, the current signal may specify a current value that the current source 52 should output. Like the source activation pattern, the current signal may be an asynchronous pattern. FIG. 6 includes an example current signal 104 that indicates when the current source 52 will output 10 mA and when it will output 20 mA.

At block 86, the processor 40 may receive a current signal status from the current detector 54. The current signal status may indicate the current detected by the current detector 54. FIG. 6 illustrates an example current signal status 106 waveform that may be detected by the current detector 54 based on the activation pattern waveform 102 and the current signal waveform 104. As shown in the current signal status 106, when the activation pattern waveform 102 is on at t1, the current signal status 106 indicates that 1.24 V has been detected by the current detector 54. In one embodiment, the current detector 54 may include a 124-ohm resistor in series with the terminal 64. As such, the voltage across the resistor may indicate the current received via the current detector 54. That is, the 1.24 V detected by the current detector 54 corresponds to a 10 mA current. At time t2, the current signal 104 changes to cause the current source 52 to output 20 mA. As such, the current signal status 106 may indicate that the voltage across the resistor is 2.48 V, which corresponds to 20 mA.

At time t3, however, the source activation pattern 102 may move to cause the current source 52 to deactivate or stop outputting the current. As such, at time t3, the current signal status 106 may indicate that there is 0 V or no current across the resistor within the current detector 54. That is, even though the current signal 104 indicates that the current source 52 should output 20 mA at time t3, since the activation pattern is off at time t3, the current source 52 may not output current, and thus the current detector 54 may not detect current.

Referring back to FIG. 5, at block 88, the processor 40 may determine whether the current signal status 106 corresponds to an expected current signal status. In one embodiment, the processor 40 may analyze the activation pattern 102 and the current signal 104 to determine an expected waveform for the current signal status 106.

In another embodiment, the processor 40 may determine whether current is detected by the current detector 52 in accordance with the activation pattern. For instance, the processor 40 may receive a current detect status signal 108 from the current detector 54. The current detect status signal 108 may indicate whether current is present across the resistor of the current detector 54 or not. As such, at block 88 of the method 80, the processor 40 may determine whether the current detect status signal 108 matches the source activation pattern 102.

If, at block 88, the processor 40 determines that the current signal status matches the expected status, the processor 40 may return to block 82. If, however, the processor 40 determines that the current signal status does not match the expected status, the processor may proceed to block 90. At block 90, the processor 40 may determine whether an error is present in the current detect status signal 108 for more than a threshold amount or period of time (e.g., 50 ms). That is, the processor 40 may determine whether the current signal status 106 or the current detect status signal 108 does not match the expected current signal status for more than the threshold amount of time. If the error is not present for less than the threshold amount of time, the processor 40 may return to block 82.

If the error is present for more than the threshold amount of time, the processor 40 may proceed to block 92 and send a disable signal to the I/O disable component 56. As such, the I/O disable component 56 may open a circuit or disconnect devices coupled to the battery control unit 36 via the terminals 62 and 64, as discussed above.

Referring back to block 88, FIG. 7 illustrates a sample current signal status 122 that does not match the expected status waveform. That is, according to the source activation pattern 102 and the current signal 104, the current detector 54 should detect a 20 mA current at time t5. However, as shown in the current signal status 122, at time t5, the current signal status 122 still indicates that a 10 mA current is present. As a result, a delta signal 124 may indicate that an error is present at time t5.

As discussed above, after the processor 40 detects the error in the delta signal 124 at block 88, the processor 40 may proceed to block 90 and determine whether the error is present for more than the threshold amount of time. As shown in an error confirmed signal 126 in FIG. 7, the error present in the delta signal 124 at time t5 is not present for more than the threshold period of time. However, at time t7, the delta signal 124 may be present for more than the threshold amount of time (e.g., 50 ms). As a result, the error confirmed signal 126 may become active at time t8 when the delta signal is present for longer than the threshold amount of time. Referring back to block 90 and FIG. 7, at time t8, the processor 40 may proceed to block 92 and send the disable signal to the I/O disable component.

Figure 7:
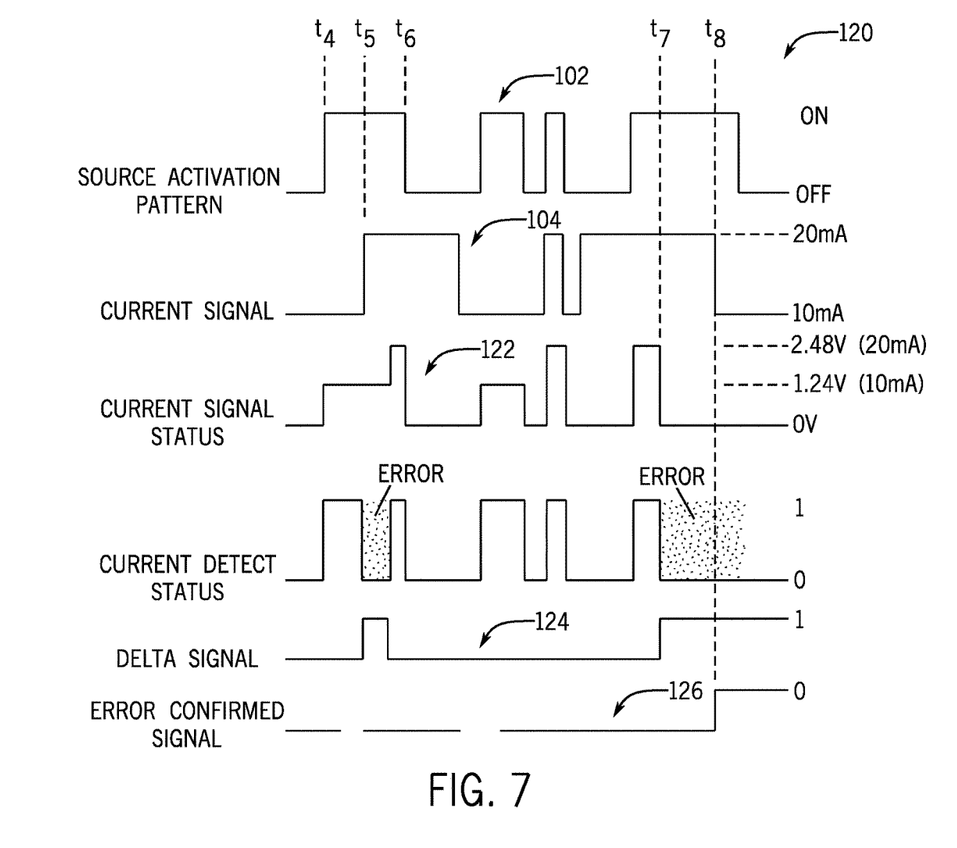
FIG. 7 includes example waveforms depicting the states of various components within the battery control unit of FIG. 4 when an error is present, in accordance with an embodiment presented herein.

Referring back to block 88, in certain embodiments, the processor 40 may proceed directly to block 92 when the processor 40 detects the error in the delta signal 124. In another embodiment, the processor 40 may generate an alarm, send a notification, or provide some other notice to a user when it detects the error in the delta signal 124. In this case, the hardware failsafe filter 58 may receive the delta signal from the current detector 54 and determine whether the delta signal indicates that an error is present and/or determine whether the delta signal indicates that an error is present for a period of time that is greater than some value (e.g., 50 ms). If both conditions are present, the hardware failsafe filter 58 may send an indication of the error to the hardware failsafe circuit 60, which may send a command to the input/output (I/O) disable component to disable the I/O components coupled to the battery control unit 36 or the like. In this way, the hardware failsafe filter 58 may disable the I/O components coupled to the battery control unit 36 regardless of the operation of the processor 40. As such, the hardware components may serve as an additional safeguard to ensure that the I/O components are disabled when the battery control unit 36 or the battery module may be compromised.

By employing the hardware failsafe filter 58 and the hardware failsafe circuit 60 to disable the I/O components independently of the operations of the processor 40, the presently disclosed embodiments may further protect the battery module from being manipulated via compromises to the operation of the processor 40. That is, the hardware components described herein may provide a redundant or independent option for protecting the I/O components.

One or more of the disclosed embodiments, alone or in combination, may provide one or more technical effects including preventing the modification of the battery control unit 36, the battery module 14, and the like. In particular, by providing an asynchronous current signal serially through protected components, the systems and methods described herein may be alerted with regard to when a component is being access or altered and may then disable the respective component. As a result, the integrity of the component and the battery module 14 itself may be preserved. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery system, comprising:
a first terminal and a second terminal configured to electrically couple to an electronic component;
a current source electrically coupled to the first terminal;
a control system configured to:
direct an asynchronous current from the current source to the first terminal according to a pattern;
receive a current signal status from a current detector, wherein the current signal status is associated with a second current received via the second terminal; and
disconnect the electronic component from the first terminal or the second terminal when the current signal status does not correspond to the pattern.

2. The battery system of claim 1, wherein the pattern is configured to indicate when the current source is activated and deactivated.

3. The battery system of claim 1, wherein the asynchronous current alternates between at least two current values based on a current signal comprising a second pattern in which the asynchronous current alternates between the at least two current values.

4. The battery system of claim 3, wherein the at least two current values comprises 10 mA and 20 mA.

5. The battery system of claim 1, wherein the control system is configured to send a disable signal to an input/output (I/O) component when the current signal status does not correspond to the pattern, wherein the I/O component is configured to break a connection path between the electronic component and first terminal or the second terminal based on the disable signal.

6. The battery system of claim 5, wherein the control system is configured to send the disable signal when the current signal status does not correspond to the pattern for more than a period of time.

7. The battery system of claim 6, wherein the period of time comprises 50 ms.

8. The battery system of claim 5, wherein the I/O disable component comprises a switch configured to disconnect the electronic component from the first terminal or the second terminal.

9. The battery system of claim 1, comprising a hardware filter configured to:
receive a delta signal from the current detector, wherein the delta signal indicates whether the current signal status corresponds to the pattern; and
disconnect the electronic component from the first terminal or the second terminal when the current signal status does not correspond to the pattern.

10. The battery system of claim 9, wherein the hardware filter is configured to disconnect the electronic component from the first terminal or the second terminal when the current signal status does not correspond to the pattern for more than a period of time.

11. The battery system of claim 9, comprising a hardware failsafe circuit configured to receive a disconnect signal from the hardware filter when the delta signal indicates that the current signal status does not correspond to the pattern, wherein the disconnect signal is configured to cause the electronic component to be disconnected from the first terminal or the second terminal.

12. The battery system of claim 11, comprising the hardware failsafe circuit configured to receive a disconnect signal from the hardware filter when the delta signal indicates that the current signal status does not correspond to the pattern for longer than a period of time, wherein the disconnect signal is configured to cause the electronic component to be disconnected from the first terminal or the second terminal.

13. The battery system of claim 1, comprising the current detector, wherein the current detector comprises a resistor, and wherein a voltage drop across the resistor is associated with the current signal status.

14. A non-transitory computer-readable medium comprising computer-executable instructions configured to cause a processor to:
    cause a current source to output an asynchronous current to a first terminal of a battery module according to a pattern;
    receive a current signal status from a current detector electrically coupled to a second terminal of the battery module, wherein the current signal status is associated with a second current received via the second terminal; and
    send a disable signal to an input/output (I/O) component when the current signal status does not correspond to the pattern, wherein the disable signal is configured to cause the I/O component to disconnect an electronic component electrically coupled to the first terminal or the second terminal from the first terminal or the second terminal.

15. The non-transitory computer-readable medium of claim 14, wherein the pattern is configured to indicate when the current source is activated and deactivated.

16. The non-transitory computer-readable medium of claim 14, wherein the processor is configured to send a current signal to the current source, wherein the current signal comprising a second pattern in which the asynchronous current alternates between two current values.

17. The non-transitory computer-readable medium of claim 14, wherein the current signal status comprises a voltage waveform that is associated with one or more current values of the second current.

18. The non-transitory computer-readable medium of claim 17, wherein the voltage waveform corresponds to a voltage across a resistor within the current detector.

19. The battery module of claim 18, wherein the computer-executable instructions are configured to cause the processor to send the disable signal to the I/O component when the current signal status does not correspond to the pattern for more than a period of time.

20. A system, comprising:
    a battery;
    a battery control unit communicatively coupled to the battery, wherein the battery control unit comprises:
        a first terminal and a second terminal configured to electrically couple to an electronic component;
        a current source electrically coupled to the first terminal;
        a failsafe circuit coupled to the second terminal; and
        a processor configured to:
            send an activation pattern to the current source configured to output a first current according to the activation pattern to the first terminal, wherein the first terminal is configured to serially couple to the electronic component; and
            send a current signal to the current source, wherein the current signal comprises a current pattern that indicates at least two different current values for the first current output by the current source;
        wherein the failsafe circuit is configured to:
            receive a signal status from a current detector configured to electrically couple to the second terminal, wherein the signal status comprises a waveform indicating one or more current values of a second current received via the second terminal; and
            send a disable signal to an input/output (I/O) component when the signal status does not match the activation pattern and the current signal, wherein the disable signal is configured to cause the I/O component to disconnect the electronic component from the first terminal or the second terminal.

21. The system of claim 20, wherein the failsafe circuit is configured to send the disable signal when the signal status does not match the activation pattern and the current signal for more than a period of time.

22. The system of claim 20, wherein the processor is configured to generate the activation pattern according to a random function.

23. The system of claim 20, wherein the failsafe circuit is configured to receive a delta signal from the current detector, wherein the delta signal indicates whether the signal status does not match the activation pattern and the current signal.

* * * * *

UNITED STATES PATENT AND TRADEMARK OFFICE
CERTIFICATE OF CORRECTION

PATENT NO. : 10,014,700 B2
APPLICATION NO. : 15/141438
DATED : July 3, 2018
INVENTOR(S) : Chuck S. Tosch It is certified that error appears in the above-identified patent and that said Letters Patent is hereby corrected as shown below:

In the Drawings

1. In Fig. 5, Sheet 4 of 6, for Block "84", in Line 1, delete "SELECTION" and insert -- SIGNAL --, therefor.

In the Specification

2. In Column 1, Line 40, delete "full hybrid systems" and insert -- full hybrid electric vehicles --, therefor.

3. In Column 1, Line 43, delete "mild hybrid systems" and insert -- mild hybrid electric vehicles --, therefor.

4. In Column 3, Line 24, delete "DRAWINGS" and insert -- BRIEF DESCRIPTION OF DRAWINGS --, therefor.

5. In Column 3, Line 29, delete "FIG. 1 is perspective" and insert -- FIG. 1 is a perspective --, therefor.

6. In Column 4, Line 44, delete "may routed" and insert -- may be routed --, therefor.

7. In Column 6, Line 34, delete "belt starter" and insert -- belt-driven starter --, therefor.

8. In Column 8, Line 51, delete "batter" and insert -- battery --, therefor.

9. In Column 12, Line 8, delete "current detector 52" and insert -- current detector 54 --, therefor.

Signed and Sealed this
Thirteenth Day of November, 2018

Andrei Iancu
*Director of the United States Patent and Trademark Office*